US006285698B1

United States Patent
Romano et al.

(10) Patent No.: US 6,285,698 B1
(45) Date of Patent: Sep. 4, 2001

(54) MOCVD GROWTH OF INGAN QUANTUM WELL LASER STRUCTURES ON A GROOVED LOWER WAVEGUIDING LAYER

(75) Inventors: Linda T. Romano; Daniel Hofstetter, both of Sunnyvale; Thomas L. Paoli, Los Altos, all of CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/160,324

(22) Filed: Sep. 25, 1998

(51) Int. Cl.$^7$ ...................................................... H01S 5/00
(52) U.S. Cl. ................................ 372/46; 372/96; 372/45
(58) Field of Search ................................. 372/46, 96, 43, 372/5; 257/117, 594

(56) References Cited

U.S. PATENT DOCUMENTS

| | | |
|---|---|---|
| 4,704,720 | 11/1987 | Yamaguchi . |
| 4,716,132 | 12/1987 | Hirata . |
| 4,755,015 * | 7/1988 | Uno et al. ............................. 385/131 |
| 4,817,110 * | 3/1989 | Tokuda et al. ......................... 372/45 |
| 5,023,198 | 6/1991 | Strege . |
| 5,042,049 * | 8/1991 | Ohtoshi et al. ........................ 372/45 |
| 5,077,752 | 12/1991 | Tada et al. . |
| 5,220,573 * | 6/1993 | Sakata et al. ........................... 372/50 |
| 5,253,262 * | 10/1993 | Kurobe et al. .......................... 372/45 |
| 5,276,702 | 1/1994 | Meliga . |
| 5,289,494 | 2/1994 | Tada et al. . |
| 5,347,533 * | 9/1994 | Higashi et al. ........................ 372/96 |
| 5,349,598 * | 9/1994 | Ouchi et al. ............................ 372/50 |
| 5,459,747 * | 10/1995 | Takiguchi et al. ...................... 372/50 |
| 5,518,955 | 5/1996 | Gotgo et al. . |
| 5,663,592 * | 9/1997 | Miyazawa et al. ................... 257/627 |
| 5,684,823 | 11/1997 | Goto et al. . |
| 5,754,714 * | 5/1998 | Suzuki et al. ............................. 385/5 |
| 5,760,885 * | 6/1998 | Yokoyama et al. ................. 356/4.01 |
| 5,960,023 * | 9/1999 | Takahashi ............................... 372/96 |
| 5,970,081 * | 10/1999 | Hirayama et al. ..................... 372/96 |
| 6,052,399 * | 4/2000 | Sun ....................................... 372/50 |

OTHER PUBLICATIONS

S. Nakamura, First Successful III–V Nitride Based Laser Diodes, International Symposium on Blue Laser and Light Emitting Diodes, Chiba Univ., Japan, pp. 119–124, Mar. 1996.
S. Nakamura, First III–V–Nitride–Based Violet Laser Diodes, Journal of Crystal Growth 170, pp. 11–15, (1997).
N. Dietz, et al., Native Defect Related Optical Properties of $ZnGeP_2$, American Institute of Physics, Sep. 1994.
G. C. Xing et al., *Substrate Effects on the Epitaxial Growth of $ZnGeP_2$ Thin Films by Open Tube Organometallic Chemical Vapor Deposition*, Jan. 1991.
F. A. Ponce et al., *Nitride–Based Semiconductors for Blue and Green Light–Emitting Devices*, Nature: International Weekly Journal of Science, Mar. 1997.

* cited by examiner

*Primary Examiner*—Frank G. Font
*Assistant Examiner*—Delma R. Flores Ruiz
(74) *Attorney, Agent, or Firm*—Oliff & Berridge, PLC

(57) ABSTRACT

Group III-V nitride semiconductors are used as light emitters for optoelectronic devices. To provide the desired range of bandgaps and band offsets in heterostructure devices, InGaN layers have to be grown. InGaN layers are difficult to grow because poor lattice mismatch between group III-V nitride alloys. Thus, a plurality of gratings or grooves are formed in the group III-V nitride layer in order to relieve strain between the group III-V nitride layer and the active region. The plurality of gratings allows segregation of In in a manner that optimizes the wavelength of light produced.

42 Claims, 5 Drawing Sheets

MOCVD GROWTH OF INGAN QUANTUM WELL LASER STRUCTURES ON A GROOVED LOWER WAVEGUIDING LAYER

BACKGROUND OF THE INVENTION

1. Field of Invention

The invention relates to the field of semiconductors. More particularly, the invention is directed to group III-V nitride semiconductor films usable in blue light emitting devices.

2. Description of Related Art

The light-emitting diode is the basic component for electrically injected semiconductor lasers. A light-emitting diode is a relatively simple semiconductor device which emits light when an electric current passes through a junction of the light-emitting diode. As shown in FIG. 1, a light-emitting diode 100 includes a back-to-back sandwich of a p-type 110 semiconductor material and an n-type 120 semiconductor material, i.e., a p-n junction, characterized by a bandgap $E_g$ 130. The bandgap 130 determines the minimum energy required to excite an electron 160 from a valence band 140 to a conduction band 150, where the electron 160 becomes mobile. Conversely, the bandgap 130 also determines the energy of a photon produced when the electron 160 in the conduction band, i.e., a conduction electron, recombines with a hole 170 in the valence band 140. When current passes through the diode 100, the electrons 160 in the conduction band 150 flow across the junction from the n-type material 120, while the holes 170 from the valence band 140 flow from the p-type material 110. As a result, a significant number of the electrons 160 and the holes 170 recombine in the p-n junction, emitting light with an energy $hv=E_g$. These semiconductor devices contain only one junction, the p-n junction, in a single material and are referred to as homojunction structures.

In order to obtain more efficient lasers, in particular, lasers that operate at room temperature, it is necessary to use multiple layers in the semiconductor structure. These devices are called heterojunction or double heterojunction lasers, depending on the number of wide bandgap layers formed.

The wavelength, and thus the color of light emitted by an LED or laser diode, depends on the bandgap $E_g$. LEDs or laser diodes that emit light in the red region of the visible spectrum have been available since the early 1990's. There has been great difficulty in developing LEDs that emit light at shorter wavelengths. Extending LED light sources into the short-wavelength region of the spectrum, the region extending from green to violet, is desirable because LEDs can then be used to produce light in all three primary colors. Shorter-wavelength laser diodes will also permit the projection of coherent radiation to focus laser light into smaller spots. That is, in the optical diffraction limit, the size of the focused spot is proportional to the wavelength of the light. Reducing the wavelength of the emitted light allows optical information to be stored and read out at higher densities.

SUMMARY OF THE INVENTION

This invention provides group III-V nitride films formed on substrates usable in short-wavelength visible light-emitting optoelectronic devices, including light-emitting diodes (LEDs) and diode lasers.

The invention provides corrugated waveguiding structures using diffraction gratings or grooves, the grating or grooved structures release the strain in the active layer, allowing In segregation in the quantum wells, and providing optical feedback. The In rich regions thus provide a bandgap suitable for emission of light in the blue region of the spectrum.

Group III-V nitrides include elements from groups III and V of the periodic table. These materials are deposited over substrates forming layered structures for optoelectronic devices, including LEDs and laser diodes. The resulting devices can emit visible light over a wide range of wavelengths.

The performance of the optoelectronic devices depends on the quality of the group III-V nitride films formed over the substrates. An important structural characteristic of the group III-V nitride films which affects their emission quality is lattice matching between each of the layers.

The group III-V nitride semiconductors, GaN, AlN and InN, and their alloys are used as active materials for opto-electronic device applications because these materials share the characteristic wide bandgap necessary for short-wavelength visible light emission. Group III-V nitrides also form strong chemical bonds which make the material very stable and resistant to degradation under high electric current densities and intense light illumination. Most optoelectronic devices based on the group III-V nitride compounds require growth of a sequence of layers with different bandgaps. In addition, the band discontinuity between layers with different bandgaps provides for carrier confinement, whereas the difference in refractive index provides optical confinement. To obtain layers with the bandgap around 2.7 eV, which will produce light in the blue region of the spectrum, InGaN alloys can be used. Since the bandgap of GaN is 3.4 eV and the bandgap of InN is 1.9 eV, an alloy group III-V with an In composition of about 20% is required to obtain blue-light emission.

Growing InGaN alloys with such a high In content on GaN has heretofore been difficult, if not impossible, using conventional techniques, such as metal-organic chemical vapor deposition (MOCVD). Specifically, when using these conventional techniques, the InGaN alloy active region tends to segregate. As the indium content is increased to produce longer-wavelength emission, the InGaN alloy becomes unstable. As a result of this instability, the InGaN alloy separates, or segregates, into In-rich regions and Ga-rich regions, so that the InGaN alloy composition, and therefore the active region bandgap energy, is no longer uniform.

This nonuniform composition causes the electroluminescence (EL) to be spectrally broad, i.e., the range of the wavelengths of the emitted light is broad. For instance, while the spectral emission widths of violet LEDs (390–420 nm.), corresponding to 10–20% In content, may be as narrow as 12–15 nm, the spectral emission width increases to 20–30 nm for blue LEDs (430–460 nm.), corresponding to a 20–30% In content, and 40–50 nm for green LEDs (500–530 nm.), corresponding to a 40–50% In content.

The poor spectral purity of green LEDs limits their application in full-color displays, where pure colors are needed to generate, by additive mixing, a broader pallette of colors. Likewise, such broad spectral emission widths also translate into broad gain spectra for laser diode structures. When the gain spectrum becomes broad, the peak gain is reduced, so that it becomes difficult to reach lasing threshold. For this reason, when formed using these conventional techniques, the performance of blue and green group III-V nitride laser diodes is expected to be poor compared to violet-emitting group III-V laser diode devices.

In order to improve the spectral purity of blue and green LEDs, and to promote the development of true blue or green group III-V nitride laser diodes, the growth of high-indium-content InGaN alloys is desirable. The alloy segregation problems must be overcome, so that the alloy content remains uniform, even when the indium content approaches 50%.

However, GaN and InN have a very large lattice mismatch which causes reduced miscibility. Thus, it has heretofore been difficult to form a group III-V nitride alloy having an In content higher than 10% using conventional growth techniques. Thus, constructing effective blue light emitting structures using InGaN grown over group III-V nitride layers has proven very difficult.

The inventors have determined that these problems are most likely caused by the lattice mismatch of over 10% between GaN and InN, which can cause reduced miscibility. The higher vapor pressure of InN may also play a role in the non-uniform alloy content of known devices formed using these conventional techniques. Although blue lasing in InGaN has already been achieved, there remain major issues concerning defect-free MOCVD growth of these materials. Also, the formation of laser mirrors for blue light lasing is difficult compared to common red and infrared semiconductor laser materials, where mirrors can be formed by cleaving along crystal planes. Such cleaving usually results in mirrors which are orthogonal to the waveguide, and perfectly flat and smooth. Thus, achieving the maximal possible reflectance in such mirrors is easily accomplished. However, GaN has a hexagonal crystal structure which results in adverse cleaving behavior. In addition, there is no lattice-matched substrate material for GaN and its ternary alloys in InGaN and AlGaN. Hence, there is no way to achieve stress-free expitaxial films. Consequently, pits are formed on the film surface to relieve the stress.

This invention thus provides a novel laser fabrication process based on a two-step epitaxial growth procedure, where the second growth step is performed on a pre-patterned surface. The pattern forms a diffraction grating with parallel grooves whose period is an integer multiple of one-half of the emission wavelength of the quantum wells in the material. Epitaxial layers are first grown over a substrate up to a lower GaN waveguiding layer and the structure is then removed from the growth reactor in order to etch the grating in the surface of the last grown layer. After the grating fabrication step, as shown in FIG. 2, an active layer is formed over the grating structure. The parameters, including a period $\Lambda$, which fulfills $\Lambda = m\lambda/2n_{eff}$, a depth t, which is typically defined by $t = \Lambda/2$, and an aspect ration $d/\Lambda$, which ideally would be $d/\Lambda = 0.5$, can be optimized to optimize lasing performance. The resulting structure has grooves formed in one or more layers. These grooves relieve stress in the subsequently grown epitaxial film. In addition, In-rich regions, i.e., reduced Ga-incorporation) occurs on the sidewalls of the grooves providing a region with a high In content. Thus, emission of light in the blue-green region of the spectrum is facilitated.

In a distributed feedback structure, a corrugation is used along the length of the laser to provide Bragg reflection instead of reflection from the end mirrors. The lack of end mirrors allows the integration of lasers on a chip with optical waveguides and other components. This type of grooved waveguiding layer provides the advantages of quantum dots, distributed feedback, and stress relief using the same structure. This type of laser enhances wavelength stability. The resulting structure according to this invention also eliminates crack propagation through the active layer and thereby enables more efficient recombination of electrons and holes.

U.S. Pat. No. 6,121,639 and U.S. patent application Ser. No. 09/127,038, filed on Jul. 31, 1998, are each herein incorporated by reference in their entireties.

These and other features and advantages of the invention are described in or are apparent from the following detailed description of the preferred embodiments.

BRIEF DESCRIPTION OF THE DRAWINGS

The preferred embodiments of the invention will be described in detail, with reference to the following figures in which.

DETAILED DESCRIPTION OF PREFERRED EMBODIMENTS

Figure 1:
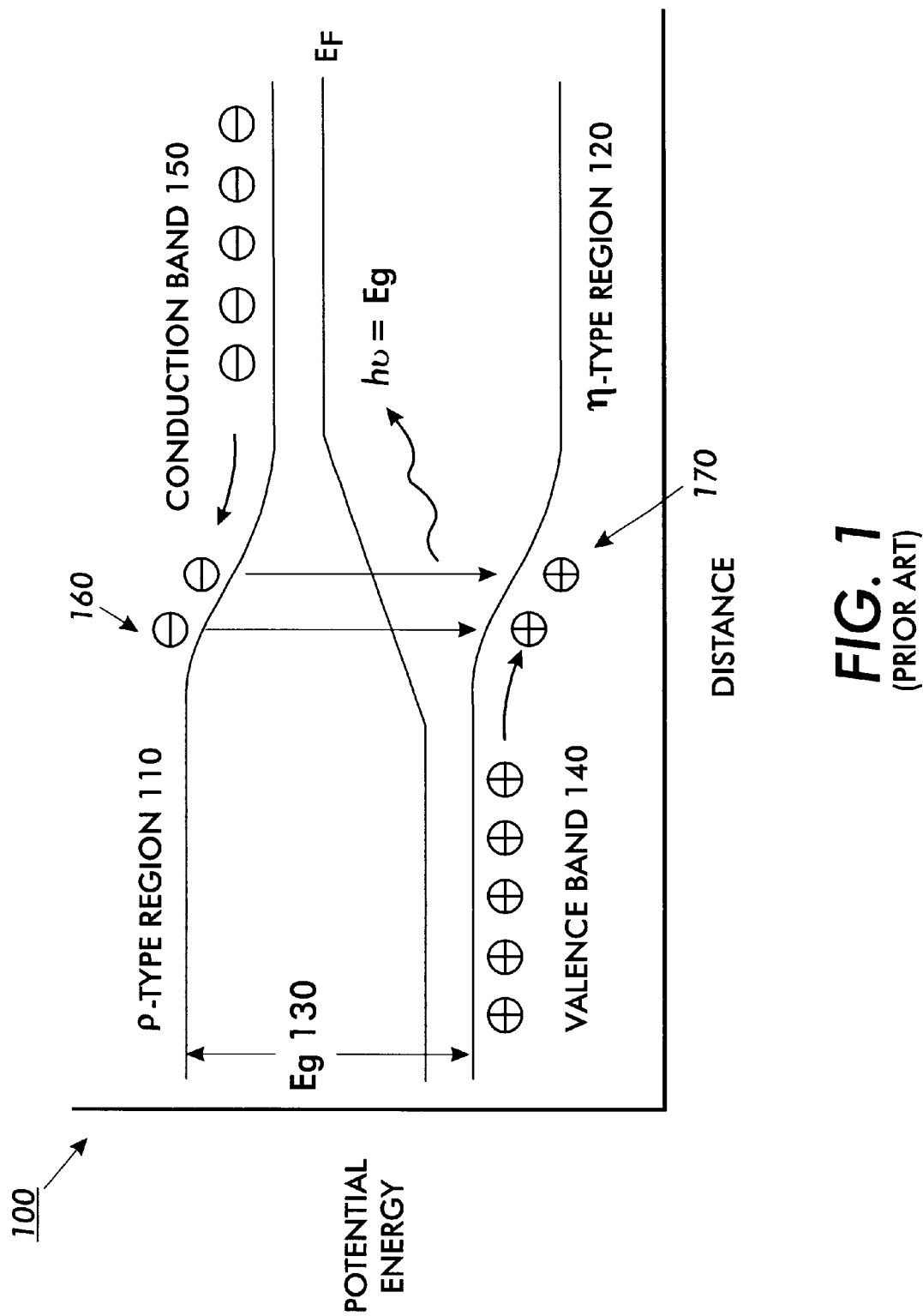
FIG. 1 shows a conventional p-n junction device.
Figure 2:
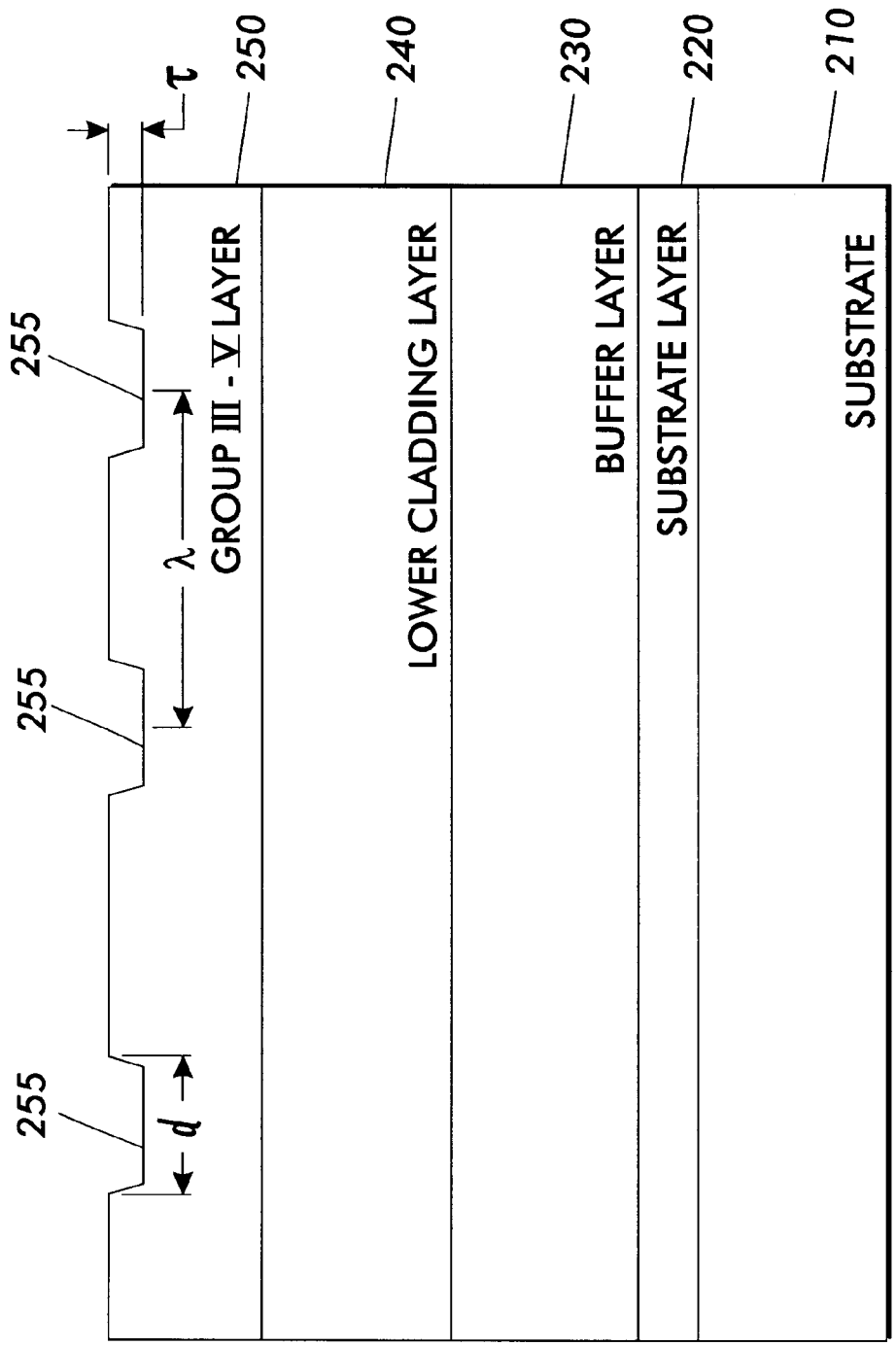
FIG. 2 shows a first portion of a growth sequence for growing a laser diode according to an embodiment of the invention.

FIG. 2 shows the formation of a semiconductor structure which includes InGaN quantum well laser structures formed on a grooved lower waveguiding layer according to this invention. Specifically, FIG. 2 shows a substrate 210, which may be formed by any known or later developed substrate material, such as, for example, sapphire or silicon carbide. In the case of sapphire, A and C-oriented single crystal sapphire is preferable for optoelectronic devices. The substrate 210 is typically several hundred microns thick, i.e., 100 to 500 $\mu$m thick.

A nucleation layer 220 is formed over the substrate 210. The nucleation layer 220 serves primarily as a wetting layer, to promote smooth, uniform coverage of the substrate 210. The nucleation layer 220 is typically either GaN, InGaN, AlN or AlGaN. The nucleation layer 220 typically has a thickness of about 100 to 500 Å. The nucleation layer 220 should have lattice parameters that are substantially aligned to that of the substrate 210. The nucleation layer 220 is typically formed as a thin amorphous layer. The nucleation layer 220 is typically deposited at low temperature, then crystallized through a solid-phase epitaxy process, usually coincident with the temperature being raised for the remainder of the structure. However, any known or later developed method for forming the described nucleation layer 220 can be used.

The nucleation layer 220 may also be formed as a plurality of layers. In addition, each layer of the plurality of nucleation layers can have different alloy concentrations or be deposited under different conditions to promote smooth film growth and to accommodate the large lattice mismatch.

A thick buffer layer 230 is then formed over the nucleation layer 220. The buffer layer 230 typically comprises a group III-V nitride, such as, GaN or AlGaN. A lower cladding layer 240 is then formed over the buffer layer 230. The lower cladding layer 240 preferably comprises a group III-V nitride, such as, AlGaN. A lower waveguiding layer 250 is then formed over the lower cladding layer 240. The lower waveguiding layer typically comprises a group III-V nitride, such as, GaN.

At this point, parallel grooves 255 are formed in the lower waveguiding layer 250. The grooves 255 are defined either by a holographic two-beam interference exposure or by electron-beam direct wiring. The grooves provide a corrugated interface between the lower waveguiding layer and a layer deposited over the grooves. They are subsequently etched into the lower waveguiding layer 250 using a chemically-assisted ion beam etching system. These parallel grooves thus define a diffraction grating whose period is an integer multiple of one-half of the emission wavelength of the quantum wells in the subsequently grown material. The latter wavelength can be determined by optical pumping and adjusted by changing the quantum well parameters, such as thickness or composition.

The grooves may be fabricated by holography using two beam interference. A 325 nm HeCd laser was used for grating exposure. Grooves with a period of 250 nm in GaN were fabricated in the GaN lower waveguiding layer. This period is three-halves of the emission wavelength of conventional InGaN quantum wells. By changing the interfering angle of the two laser beams, the period of the diffraction pattern, and thus the grating period Λ, can be accurately adjusted. Once the grooves have been transferred into the GaN layer using chemically-assisted ion beam etching, the substrate is returned to the MOCVD refractor in order to grow the lower waveguiding lower, quantum wells, the upper waveguiding layer, the upper cladding, and the contact layer.

Figure 3:
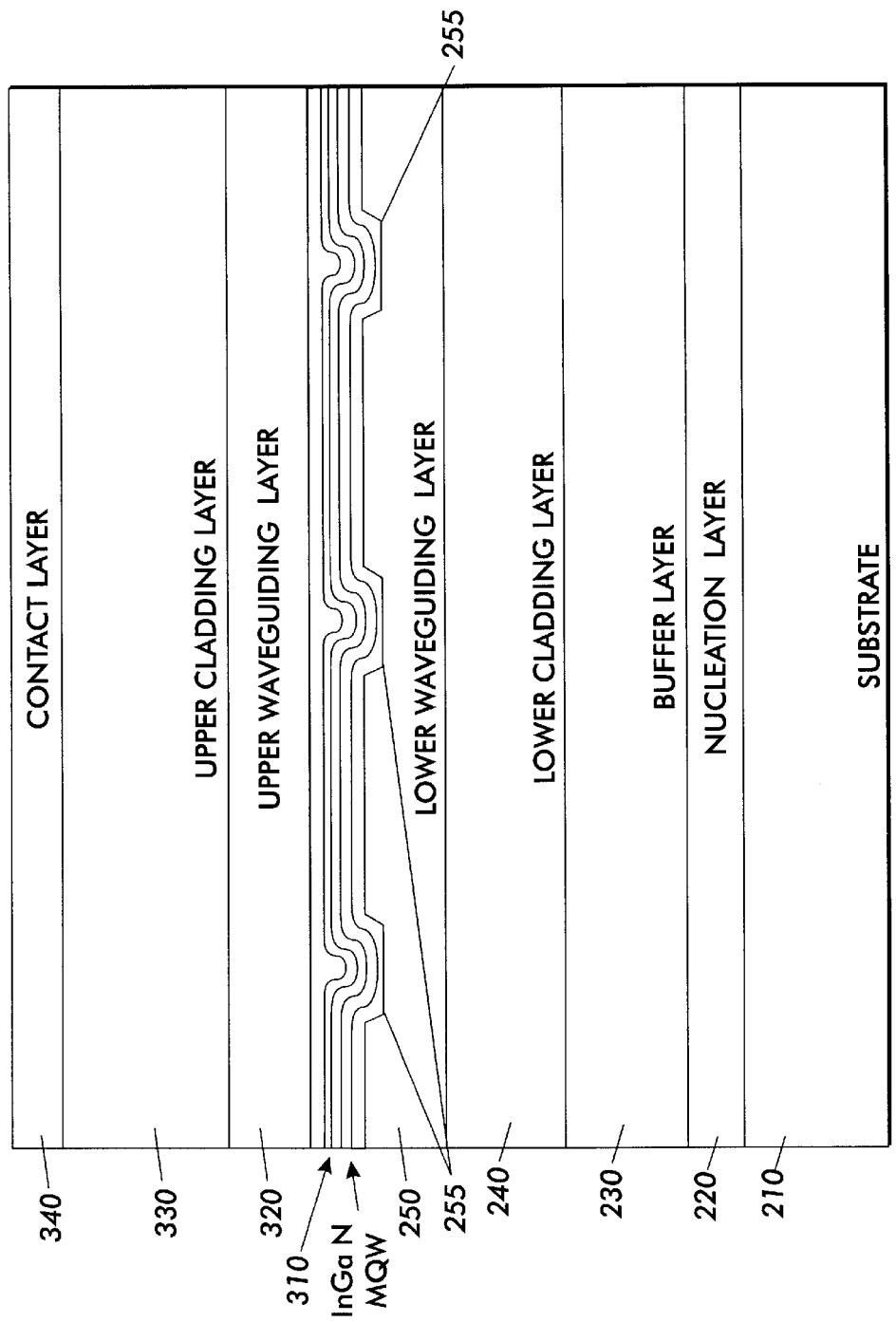
FIG. 3 shows a second portion of the growth sequence for growing a laser diode according to an embodiment of the invention.

FIG. 3 shows the further formation steps for the structure shown in FIG. 2 once the grooves 255 have been formed. An active layer 310 and an upper waveguiding layer 320 are formed over the lower cladding layer 240, the lower waveguiding layer 250 and the grooves 255. The active layer 310 comprises InGaN quantum wells separated by GaN or InGaN barrier layers. The active layer 310 is a single quantum well structure or a multiple quantum well structure for light emission.

An upper waveguiding layer 320 is then formed over the active layer 310. The upper waveguiding layer 320 comprises GaN. An upper cladding layer 330 is then formed over the upper waveguiding layer 320. The upper cladding layer 330 comprises AlGaN. A contact layer 320 is then formed over the upper cladding layer 330. The contact layer 340 comprises GaN.

Figure 4:
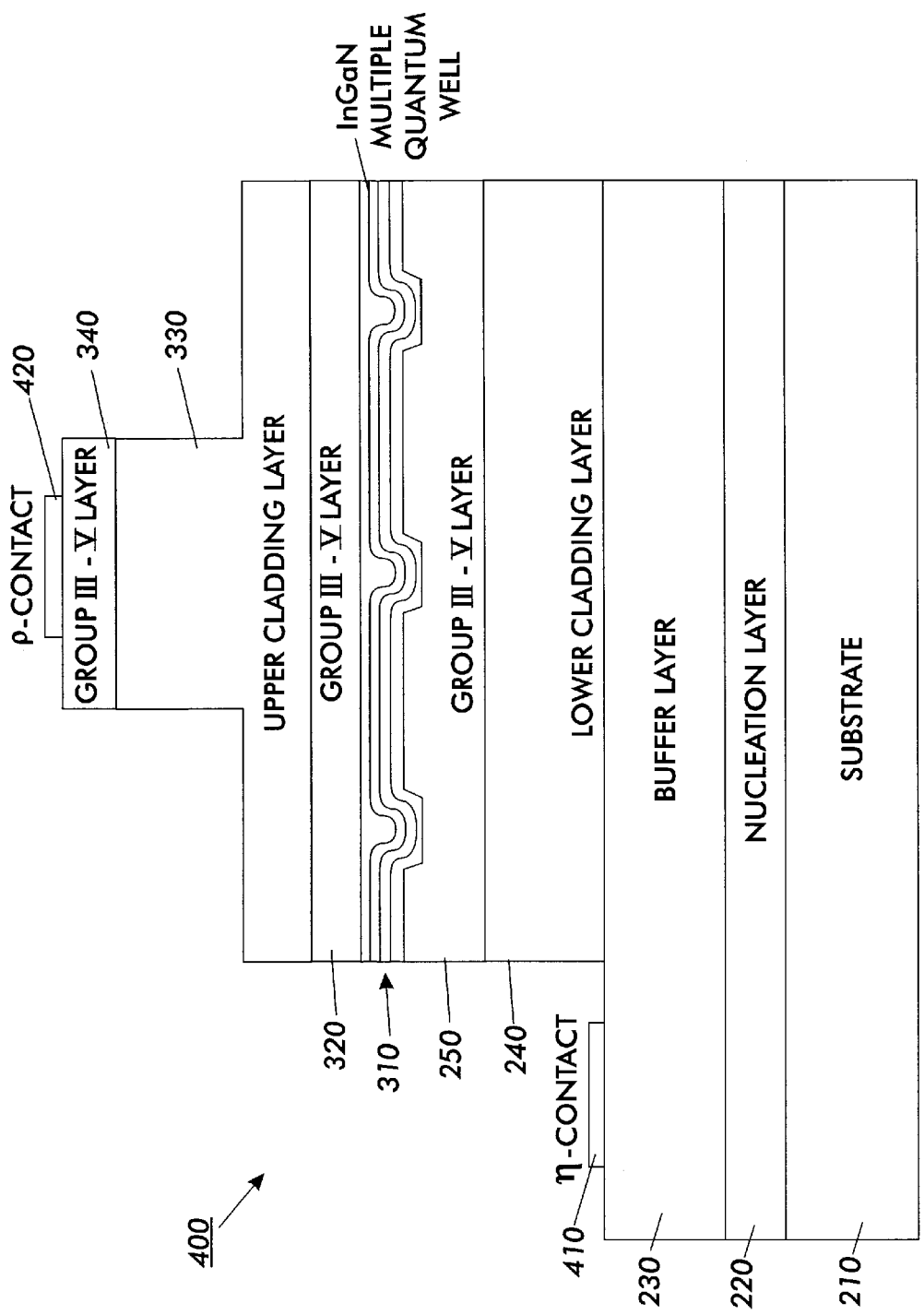
FIG. 4 shows a laser diode structure according to an embodiment of the invention.

FIG. 4 shows the semiconductor structure formed according to the process shown in FIGS. 2 and 3 incorporated into a completed laser diode structure 400. An n-electrode 410 is formed over the buffer layer 230. A p-electrode 420 is formed over the contact layer 340. In the resulting structure, the nucleation layer 220, the buffer layer 230, the lower cladding layer 240, and the lower waveguiding layer 250 are all doped n-type. The upper waveguiding layer 320, the upper cladding layer 330 and the contact layer 340 are all doped p-type. The lower cladding layer 240, the upper cladding layer 330, the lower waveguiding layer 250 and the upper waveguiding layer 320 provide optical and electrical confinement. The action of the grating within this device is threefold: Since In is known to segregate at the typical growth conditions, its mole fraction will periodically fluctuate within the quantum wells. Higher In composition is expected in the grooves, and a lower In mole fraction is expected in the regions between or around the grooves. In agreement with many experimental results, these fluctuations of the In composition have a positive impact on the luminescence properties of InGaN. They are commonly referred to as quantum-dot like potential fluctuations, as described in the articles, "First III-V Based Violet Laser Diodes", *Journal of Crystal Growth*, 170 (1995), pp. 11–15, by Shuji Nakamura, and "First Successful III-V Nitride Based Laser Diodes", *International Symposium On Blue Laser and Emitting Diodes*, Chiba Univ., Japan, Mar. 5–7, 1996, pp. 119–124, by Shuji Nakamura, which are both herein incorporated by reference. Under the growth conditions used for quantum well growth, the grooves will eventually be planarized entirely, as has been observed in experiments overgrowing surface pits and cracks. Therefore, only a slight increase of the scattering loss within the InGaN/GaN waveguide is expected.

Pitting is considered to be the result of strain. In the structure described above, the grooves are formed artificially along straight lines with a defined separation. Such a two-dimensional growth template, which can be considered a pre-pitted substrate, will efficiently prevent nature pitting via partial relief of strain.

Since random pitting can also occur during growth of layers other than the GaN lower waveguiding layer, a pre-patterned growth template as described above can be used to prevent random pitting in any of these layers. Consequently, the grooved interface can be between the GaN buffer layer and the lower cladding layer, between the lower cladding layer and the lower waveguiding layer, incorporated into the lower portion of the lower cladding layer, or between the lower waveguiding layer and the active region. Thus, the plurality of grooves can be formed between any of the layers described in this application. In the former cases, the grooves provide only a means to structurally improve the quality of the grown layers and therefore are not necessarily at the Bragg resonance wavelength.

However, according to the preferred embodiment, the grating, or grooves, are located on the top of the lower waveguiding layer and a grating period is chosen which is an integer multiple of the Bragg resonance wavelength. By choosing the grating period as an integer multiple of one-half of the quantum well emission wavelength, the backward and forward traveling waves in the waveguide can be coupled, resulting in distributed feedback. When properly designed, this mechanism will provide very efficient optical feedback, hence eliminating the need to form cavity mirrors by polishing and/or HR coating of laser facets. In contrast to Fabry-Perot type laser resonators, distributed feedback lasers need only marginal facet quality in order to produce an acceptable far field.

The nucleation layer 220, the buffer layer 230, the lower cladding layer 240, the lower waveguiding layer 250, the active region 310, the upper waveguiding layer 320, the upper cladding layer 330 and the contact layer 340 can all be formed utilizing any conventional or later developed technique, such as, for example, metal-organic chemical vapor deposition (MOCVD) or molecular beam epitaxy. Those skilled in the art will appreciate the conditions under which these deposition techniques are conducted. The grooves 255 can be formed by any conventional or later developed etching technique, such as, for example, chemically-assisted ion beam etching.

As is known in the art, multiple confinement and contact layers can be provided within the laser diode structure 400. Thus, the lower cladding layer 240, the upper cladding layer 330, and the group III-V nitride layers 250 and 320 are illustrative and are not meant to limit the number of group III-V nitride layers which may be formed within the laser diode structure 400.

In operation, an electric current is applied through the p-electrode 420 and the n-electrode 410. Electrons in a conduction band flow from the n-doped layers 220, 230, 240 and 250 into a lower energy state in the active layer 310. Current applied at the p-electrode 420 causes holes in the valance band of the contact layer 340, upper cladding layer 330 and upper waveguiding layer 320 to flow into the active layer 310. Thus, electrons from the n-doped layers 220, 230, 240 and 250 recombine with holes from the p-doped regions 320,330 and 340 in the active layer 310. Recombination of holes with electrons in the active layer 310 results in the emission of light. In this case, because the structure has a bandgap of about 3.0 eV, light in the blue region of the spectrum is emitted. Depending on the diffraction order of the grating used, these devices can be surface or edge emitters. For even diffraction orders, surface emission will be observed; for odd ones, edge emission is expected.

The laser diode structure according to the invention described above can be applied to any device requiring compact laser structures, including high resolution laser printing devices, digital printers, display devices, projection displays, high density optical storage devices, including magneto-optical storage devices, including CD-ROM and DVD's whereby data is stored on a magneto-optical disk, fiber-optic communications devices, including for fiber optic emitters and repeaters and undersea communications devices (sea water is most transparent in the blue-green spectrum). The LED structure according to the invention can also be applied to any device requiring compact LED structures, including illumination devices and full color displays, including monolithically integrated pixels for full color displays.

Figure 5:
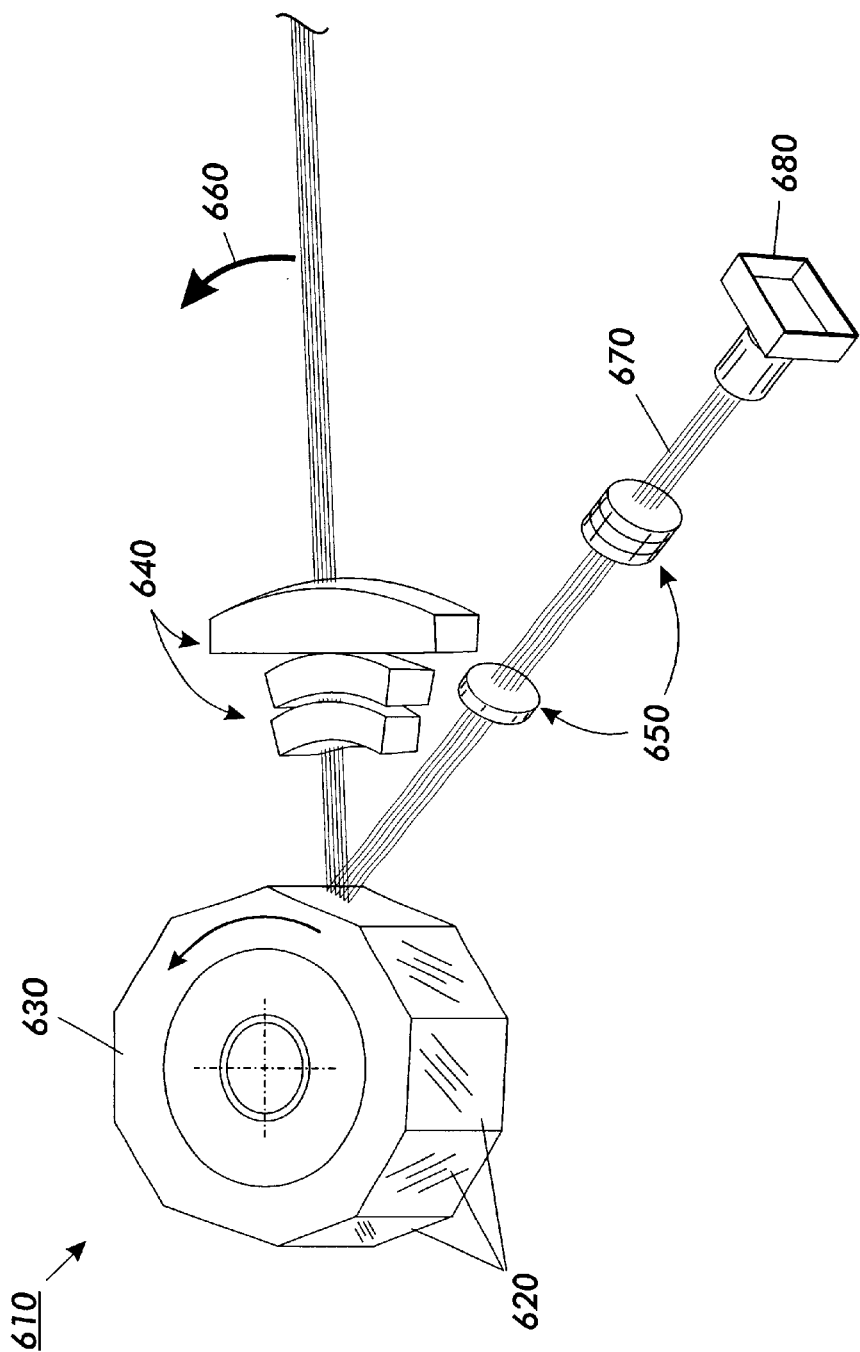
FIG. 5 shows the laser diode structure according to an embodiment of the invention incorporated into a reprographic printing system.

FIG. 5 shows the laser diode according to an embodiment of the invention implemented into a laser printing device. FIG. 5 shows a raster output scanner 610, which includes a laser source 680 that outputs multiple laser beams 670 from a substantially common spatial location. Each beam is independently modulated with data appropriate to expose a photoreceptive element in accordance with a desired image. An input optical system 650 serves to direct laser beams 670 onto overlapping co-axial optical paths such that they illuminate a rotating polygon 630 having a plurality of facets 620. The rotating polygon 630 repeatedly and simultaneously deflects the laser beams in the direction indicated by the arrow 660. The deflected laser beams are input to a single set of imaging and correction optics 640, which focus the laser beams and correct for errors, such as polygon angle error and wobble. The laser diode structure according to the invention, such as, for example, the laser diode 400 shown in FIG. 4 may be incorporated into the laser source 680 in order to provide light in the blue-green emission spectrum.

While the invention has been described in conjunction with specific embodiments as described above, it is evident that many alternatives, modifications and variations are apparent to those skilled in the art. Accordingly, the preferred embodiments of the invention as set forth above are intended to be illustrative and not limiting. Various changes could be made without departing from the spirit and scope of the invention.

What is claimed is:

1. A semiconductor structure, comprising:
   a buffer layer;
   a lower cladding layer formed over the buffer layer;
   a lower waveguiding layer formed over the lower cladding layer;
   an active layer formed over the lower waveguiding layer;
   an upper waveguiding layer formed over the active layer; and
   a plurality of grooves providing a corrugated interface formed under the active layer.

2. The semiconductor structure according to claim 1, comprising a top adjacent layer having a first portion that is disposed in the grooves and a second portion comprising the remainder of the top adjacent layer, the first and second portions having different compositions.

3. The semiconductor structure according to claim 2, wherein the composition of said first portion periodically varies in phase with the period of the second portion.

4. The semiconductor structure according to claim 1, further comprising a light emitting layer formed between the plurality of grooves and the upper waveguiding layer.

5. The semiconductor structure according to claim 1, further comprising:
   a substrate formed under the lower cladding layer;
   a nucleation layer formed over the substrate;
   a buffer layer formed over the nucleation layer and formed under the lower cladding layer;
   an upper cladding layer formed over the upper waveguiding layer; and
   a contact layer formed over the upper cladding layer.

6. The semiconductor structure according to claim 1, wherein the plurality of grooves is formed in the lower waveguiding layer.

7. The semiconductor structure according to claim 6, wherein the composition of the active layer within the grooves is substantially different from the composition of the active layer between the grooves.

8. The semiconductor structure according to claim 6, wherein the composition of the active layer periodically varies in phase with the period of the plurality of grooves.

9. The semiconductor structure according to claim 4, wherein the compositional periodicity is an integer multiple of half the wavelength emitted by the light emitting layer, as measured in the material of the light emitting layer.

10. The semiconductor structure according to claim 1, wherein the lower cladding layer comprises AlGAN.

11. The semiconductor structure according to claim 1, wherein the lower waveguiding layer comprises GaN.

12. The semiconductor structure according to claim 1, wherein the active layer comprises InGaN quantum wells and GaN or InGaN barriers.

13. The semiconductor structure according to claim 12, wherein the mole fraction of In within the active layer in the grooves is substantially greater than the mole fraction of In within the active layer between the grooves.

14. The semiconductor structure according to claim 12, wherein the mole fraction of In within the active layer periodically varies in phase with the period of the plurality of grooves.

15. The semiconductor structure according to claim 6, wherein the layer over the corrugated interface has substantially no random pits or cracks.

16. The semiconductor structure according to claim 1, wherein the semiconductor structure emits light with a wavelength within a range including 430 nm to 650 nm.

17. The semiconductor structure according to claim 6, wherein the nucleation layer comprises GaN.

18. The semiconductor structure according to claim 6, wherein the lower and upper cladding layers comprise AlGaN.

19. The semiconductor structure according to claim 6, wherein the contact layer comprises GaN.

20. The semiconductor structure according to claim 6, wherein the nucleation layer, the buffer layer, the lower cladding layer and the lower waveguiding layer are one of n-type doped and p-type doped and the upper waveguiding layer, the upper cladding layer and the contact layer are the other of n-type doped and p-type doped.

21. The semiconductor structure according to claim 6, wherein the cladding layers provide optical confinement.

22. The semiconductor structure according to claim 6, wherein the upper waveguiding layer and the lower waveguiding layer provide electrical confinement for injected carriers.

23. An image forming apparatus that forms an image on a light sensitive medium, the image forming apparatus including at least one light source that includes the semiconductor structure of claim 1.

24. The image forming apparatus according to claim 23, wherein the image forming apparatus includes at least one of a laser printer, a digital printer, a display device and an illumination device.

25. A data storage apparatus that stores data on a medium, the data storage apparatus including at least one light source that includes the semiconductor structure of claim 1.

26. The data storage device according to claim 25, wherein the data storage apparatus comprises a magneto-optical storage device.

27. A communications apparatus that communicates information through a communications transmission medium, the communications apparatus including at least one light source that includes the semiconductor structure of claim 1.

28. The communications apparatus according to claim 27, wherein the communications apparatus comprises a fiber optic network.

29. The semiconductor structure according to claim 1, wherein the active layer has substantially no random pits or cracks.

30. A method of forming a semiconductor structure, comprising:
    forming a buffer layer;
    forming a lower cladding layer over the buffer layer;
    forming a lower waveguiding layer over the lower cladding layer;
    forming an active layer over the lower waveguiding layer;
    forming an upper waveguiding layer over the active layer; and
    forming a plurality of grooves providing a corrugated interface under the active layer.

31. The method of forming a semiconductor structure according to claim 30, further comprising:
    forming a nucleation layer over a substrate, the nucleation layer also formed under the lower cladding layer;
    forming a buffer layer over the nucleation layer and under the lower cladding layer;
    forming an upper cladding layer over the upper waveguiding layer; and
    forming a contact layer over the upper cladding layer.

32. A semiconductor structure, comprising:
    a buffer layer;
    a lower cladding layer formed over the buffer layer;
    a lower waveguiding layer formed over the lower cladding layer;
    an active layer comprising InGaN formed over the lower waveguiding layer;
    an upper waveguiding layer formed over the active layer;
    a plurality of grooves providing a corrugated interface formed between at least any two adjacent layers and under the active layer; and
    In-rich regions on portions of the grooves.

33. The semiconductor structure according to claim 32, wherein the active layer has substantially no random pits or cracks.

34. An image forming apparatus that forms an image on a light sensitive medium, the image forming apparatus comprising at least one light source including the semiconductor structure of claim 32.

35. A semiconductor structure, comprising:
    a nucleation layer;
    a buffer layer formed over the nucleation layer;
    a lower cladding layer formed over the buffer layer;
    a lower waveguiding layer formed over the lower cladding layer;
    an active layer formed over the lower waveguiding layer;
    an upper waveguiding layer formed over the active layer; and
    a plurality of grooves providing a corrugated interface formed between at least any two adjacent layers and under the active layer.

36. The semiconductor structure according to claim 35, wherein the active layer has substantially no random pits or cracks.

37. An image forming apparatus that forms an image on a light sensitive medium, the image forming apparatus comprising at least one light source including the semiconductor structure of claim 35.

38. A semiconductor structure formed over a substrate, comprising:
    a cladding layer formed over the substrate;
    a lower waveguiding layer formed over the cladding layer;
    an active layer formed over the lower waveguiding layer;
    an upper waveguiding layer formed over the active layer; and
    a plurality of grooves providing a corrugated interface formed between the substrate and the active layer.

39. The semiconductor structure according to claim 38, wherein the active layer has substantially no random pits or cracks.

40. An image forming apparatus that forms an image on a light sensitive medium, the image forming apparatus comprising at least one light source including the semiconductor structure of claim 38.

41. The semiconductor structure according to claim 32, wherein the plurality of grooves are directly under the active layer.

42. The semiconductor structure according to claim 35, wherein the plurality of grooves are directly under the active layer.

* * * * *

UNITED STATES PATENT AND TRADEMARK OFFICE
CERTIFICATE OF CORRECTION

PATENT NO. : 6,285,698 B1
DATED : September 4, 2001
INVENTOR(S) : Linda T. Romano et al.

Page 1 of 1

It is certified that error appears in the above-identified patent and that said Letters Patent is hereby corrected as shown below:

Column 1,
Line 4, insert new paragraph:
-- This invention was made with Government support under Agreement No. MDA972-96-3-0014 awarded by ARPA. The Government has certain rights in this invention. --.

Signed and Sealed this

Thirteenth Day of June, 2006

JON W. DUDAS
*Director of the United States Patent and Trademark Office*